United States Patent [19]
Brennan

[11] 3,955,146
[45] May 4, 1976

[54] CIRCUIT FOR COUPLING AN ANTENNA TO A LOAD

[75] Inventor: Richard L. Brennan, Marietta, N.Y.

[73] Assignee: The United States of America as represented by the Secretary of the Navy, Washington, D.C.

[22] Filed: June 30, 1972

[21] Appl. No.: 267,829

[52] U.S. Cl. .................................. 330/17; 330/21; 330/30 D; 330/32
[51] Int. Cl.² ........................................ H03F 3/04
[58] Field of Search ............... 330/17, 19, 21, 31, 330/32, 30 D, 69; 333/32

[56] References Cited
UNITED STATES PATENTS

| | | |
|---|---|---|
| 3,077,566 | 2/1963 | Vosteen ........................... 330/17 X |
| 3,426,245 | 2/1969 | Yurasek ........................... 330/17 X |
| 3,456,206 | 7/1969 | Kwartiroff ........................ 333/32 X |
| 3,564,444 | 2/1971 | Walsh .............................. 330/32 X |

*Primary Examiner*—James B. Mullins
*Assistant Examiner*—Lawrence J. Dahl
*Attorney, Agent, or Firm*—R. Sciascia; R. Beers; S. Scheinbein

[57] ABSTRACT

A circuit coupling an antenna to a load uses an integrated circuit differential amplifier with emitter feedback, a buffer amplifier and various adjusting networks to achieve constant output impedance independent of input loading over a wide range of frequencies. The adjusting networks also allow precision gain matching and phase matching between units.

1 Claim, 2 Drawing Figures

CIRCUIT FOR COUPLING AN ANTENNA TO A LOAD

BACKGROUND OF THE INVENTION

The present invention relates generally to devices for coupling a source to a load and more particularly to constant impedance coupling devices for providing impedance matching over a wide band of frequencies between a load having substantially constant impedance and a source, such as an antenna, having an impedance that varies substantially with frequency.

Coupling a broad band antenna to a load presents problems of impedance matching because the impedance of the antenna varies substantially with frequency. In order to minimize the standing wave ratio in the transmission line, the impedance of the antenna must be matched to the impedance of the load. One way of approaching this problem is to design the antenna itself to have the desirable impedance characteristic. This solution is unsatisfactory since it results in a heavy, cumbersome antenna which still does not provide the desired impedance characteristics over a wide enough range of frequencies. Also, the design of an antenna for an impedance characteristic often interferes with the design of the antenna for its primary function.

Another approach to the problem is to provide an inductor-capacitor network in the transmission line and adjust the values of the elements to achieve an impedance match. This solution requires the use of a large number of expensive components, requires adjustment of component values for different frequencies, and is impractical for true broadband applications.

A few electronic circuits have been developed to deal with this problem but none has provided the ideal solution.

SUMMARY OF THE INVENTION

The invention comprises a system for minimizing the standing wave ratio on a transmission line which connects a constant impedance load to a variable impedance source. The device of the invention accomplishes this result by isolating the load from the source so that the load sees only the output impedance of the device, which is constant and matched to the impedance of the load. Thus the standing wave ratio on the transmission line between the device and the load is minimized.

The impedance of the source can vary over a wide range without affecting the impedance match. One result is that the optimum impedance match is achieved during true broadband operation. Frequency changes within the operating band have no effect on the impedance presented to the load. The device of the invention has the further advantage that it allows the sources themselves to be interchanged without requiring anything to be done about impedance matching. A variety of different antennas could be connected to the load through the device of the invention without affecting the impedance match. Antennas or elements could be added to or substracted from the then connected antenna or antennas (such as adding antennas in a beam forming phased array) without affecting the impedance match.

The device of the invention includes phase and gain adjusting features. This allows individual units to be matched as to phrase and gain and compensates for variations in the parameters of the circuit components. This feature is especially important when a plurality of the units are used together in a single system. For example, in a phase interferometer direction finding system, each antenna transmission line would include one of the units. Since the phase and amplitude of the signals from the antennas is compared, it is clearly advantageous to have closely matched units.

DETAILED DESCRIPTION OF THE PREFERRED EMBODIMENT

Figure 1:
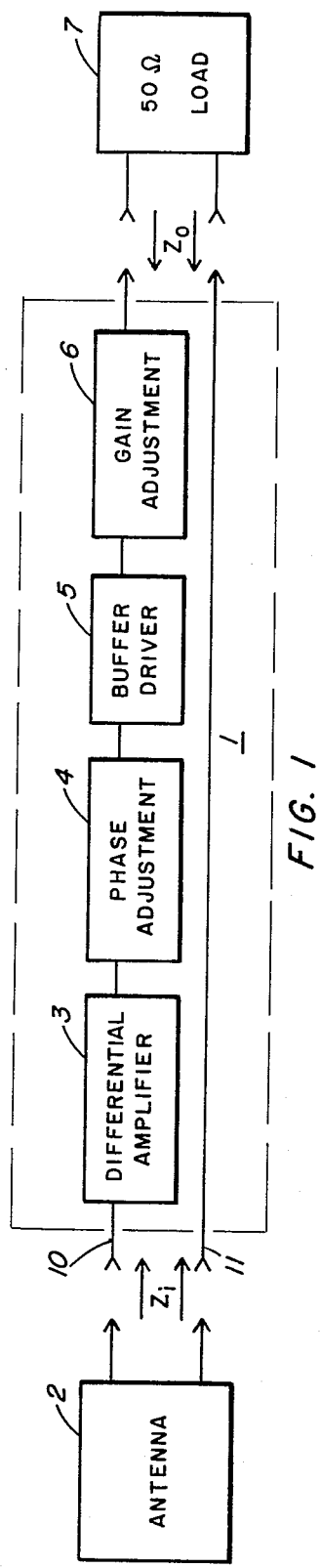
FIG. 1 shows the preferred embodiment of the invention in block diagram form.

Referring to FIG. 1, the block diagram of the circuit of the invention is shown in box 1 formed of dashed lines. The signal from antenna 2 is received on terminals 10 and 11 by differential amplifier circuit 3. A phase adjustment 4 is provided to compensate for phase mismatch between individual differential amplifiers in different units. Buffer driver stage 5 provides isolation and a constant output impedance. Gain adjustment 6 is provided to compensate for gain mismatch between units. Load 7 has a constant impedance such as 50 ohms.

Figure 2:
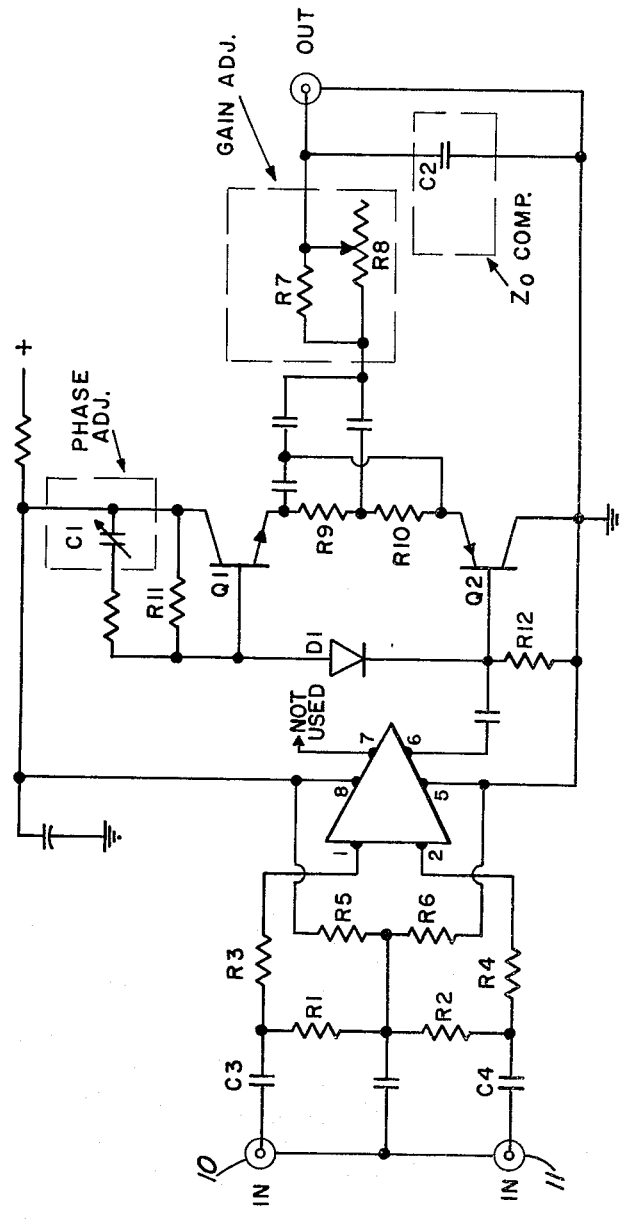
FIG. 2 shows the preferred embodiment of the invention in schematic diagram form.

Referring to FIG. 2, resistors R1 and R2 terminate the antenna transmission line. The signal is coupled to the differential amplifier 30 through capacitors C3 and C4 and through spurious oscillation suppression resistors R3 and R4. Resistors R5 and R6 are of equal value and form a voltage divider so that the potential at the junction of R1 and R2 is one half the applied potential. Amplifier 30 is a differential amplifier having a flat gain characteristic over a wide band of frequencies such as a Fairchild $\mu$A733IC broadband video amplifier with a frequency response from DC to 100 MHZ. It is temperature compensated and has an internally preset fixed gain. To attain an output impedance which is independent of input impedance it is necessary to have a negligible reverse signal transfer function; therefore, a closed loop feedback system can not be used. Emitter feedback in the $\mu$A733 provides feedback without closing the loop between input and output. This feedback technique, plus additional isolation provided by the buffer driver, allows maximum isolation of reverse signal transfer.

Variable capacitor C1 provides a phase adjustment to allow for phase mismatch between amplifiers. The Fairchild $\mu$A733 has maximum phase mismatch of 7° at 30 MHZ; therefore, 14° of variable phase correction is provided to allow exact alignment for worst case deviations.

The buffer driver 5 is a complementary emitter follower operating in class A mode. NPN transistor Q1, PNP transistor Q2, emitter resistors R9 and R10, bias resistors R11 and R12 and diode D1 form the buffer driver. Diode D1 enables the buffer driver to operate in class A mode. Q1 may be a 2N8101, Q3 a 2N8301 and D1 a IN4157. Alternatively, an integrated circuit such as a NH002, a complementary emitter follower made by National Semiconductor, may be used. A complementary emitter follower is used so that the output impedance will be the same on both the positive and the negative swings of the input wave. The buffer stage must have a large gain bandwidth product to insure small propogation delay and, therefore, precise phase matching. The buffer stage of FIG. 2 has a gain bandwidth product of 800 MHZ. If the output impedance of the buffer driver is smaller than the desired output impedance, a fixed resistor R7 is disposed between the buffer and the output terminals, providing a constant output impedance composed primarily of the fixed resistance in series with the output impedance of the buffer. In the event that the output impedance of the buffer stage is somewhat frequency dependent, reactive compensation (shown as $Z_o$ comp. in FIG. 2) is added. The disclosed buffer stage has a flat output impedance characteristic from 1 to 20 MHZ but the impedance increases above 20 MHZ. Therefore a capacitor C2, whose impedance decreases with frequency is used for compensation.

Variable resistor R8 provides gain adjustment so that the gain of individual units can be matched. Since there is only a ½ dBm gain mismatch between amplifiers, a 1 dBm adjustment is used in the disclosed embodiment. The variable resistor has a large value of resistance compared to fixed resistance R7 so that the gain setting has an insignificant effect on output impedance.

Although the preferred embodiment relates to an antenna lead in system, it is obvious that the invention applies to any system which requires the connection of a source of variable impedance to a load of fixed impedance.

Obviously, many modification and variations of the present invention are possible in light of the above teachings. It is therefore to be understood that, within the scope of the appended claims, the invention may be practiced otherwise than as specifically described.

What is claimed is:

1. A circuit for coupling a variable impedance source to a constant impedance load comprising:

means, connected to the source, for amplifying a signal from the source, said means including a fixed-gain differential amplifier having emitter feedback;

means, connected between the amplifying means and the load, for presenting a constant impedance output to the load, said output impedance being equal to the impedance of the load, said constant impedance output means comprising a complementary emitter follower, the latter including a PNP transistor, a NPN transistor and a diode having its anode connected to the base of the NPN transistor and its cathode connected to the base of the PNP transistor; and means for adjusting the phase of the signal connected between the amplifier and the emitter follower.

* * * * *